United States Patent
Joo et al.

(10) Patent No.: US 6,960,788 B2
(45) Date of Patent: Nov. 1, 2005

(54) IMAGE RECOGNITION DEVICE AND LIQUID CRYSTAL DISPLAY APPARATUS HAVING THE SAME

(75) Inventors: In-Su Joo, Seongnam-si (KR); Joon-Hoo Choi, Seoul (KR); Jean-Ho Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/649,107

(22) Filed: Aug. 26, 2003

(65) Prior Publication Data
US 2004/0211960 A1 Oct. 28, 2004

(30) Foreign Application Priority Data
Apr. 25, 2003 (KR) .............................. 10-2003-0026249

(51) Int. Cl.[7] .............................................. H01L 29/04
(52) U.S. Cl. .......................... 257/59; 257/72; 257/401
(58) Field of Search .......................... 257/59, 72, 350, 257/401, 414, 431

(56) References Cited
U.S. PATENT DOCUMENTS
6,570,197 B2 * 5/2003 Joo ............................ 257/222
* cited by examiner Primary Examiner—Mark V. Prenty
(74) Attorney, Agent, or Firm—DLA Piper Rudnick; Gray Cary US LLP (57) ABSTRACT

In an image recognition apparatus and an LCD apparatus having the same, a plurality of gate lines arranged in a transparent substrate has a predetermined slope such that the gate lines intersect with two sides of the transparent substrate, which are adjacent to or facing each other. A plurality of sensing signal output line arranged in the transparent substrate is substantially perpendicular to the gate lines. An image recognition sensor is formed on a pixel area defined by the gate and sensing signal output lines adjacent to each other. The image recognition sensor senses an image pattern of an object in response to gate driving signals from the gate lines and outputs the sensed image pattern through the sensing signal output lines. Accordingly, the LCD apparatus may prevent appearance of the moiré image and deterioration of the display quality of the LCD panel.

20 Claims, 7 Drawing Sheets

IMAGE RECOGNITION DEVICE AND LIQUID CRYSTAL DISPLAY APPARATUS HAVING THE SAME

CROSS-REFERENCE TO RELATED APPLICATION

This application relies for priority upon Korean Patent Application No. 2003-26249 filed on Apr. 25, 2003, the contents of which are herein incorporated by reference in its entirety.

BACKGROUND OF THE INVENTION

1. Field of the Invention

The present invention relates to an image recognition device and an LCD (Liquid Crystal Display) apparatus having the same, and more particularly to an image recognition device capable of improving a display quality and productivity and an LCD apparatus having the same.

2. Description of the Related Art

An amorphous-silicon thin film transistor liquid crystal display apparatus (a-Si TFT-LCD apparatus), which is a kind of flat panel display, is widely applied to an electronic instrument, for example, such as a notebook computer, a monitor, a television set, a mobile communication system, a hand-held electronic appliance and so on.

Also, since the a-Si TFT-LCD, generally, includes a photosensitive material that is chemically changeable in response to a light, the a-Si TFT-LCD may be broadly used to biometrics industries as a photoelectric sensor.

The biometrics industries relate to a personal verification system using inherent biological properties, for example, such as a fingerprint, a voice, a facial feature, a hand or an eye iris. In view of cost, convenience and accuracy, a personal verification system using the fingerprint among the inherent biological properties is widely used.

A fingerprint recognition device, generally, is disposed on an LCD panel that displays an image. When both pixel areas of the fingerprint recognition device and the LCD panel are not exactly aligned with each other while the fingerprint recognition device is disposed on the LCD panel, a moiré image may appear thereon.

Figure 1:
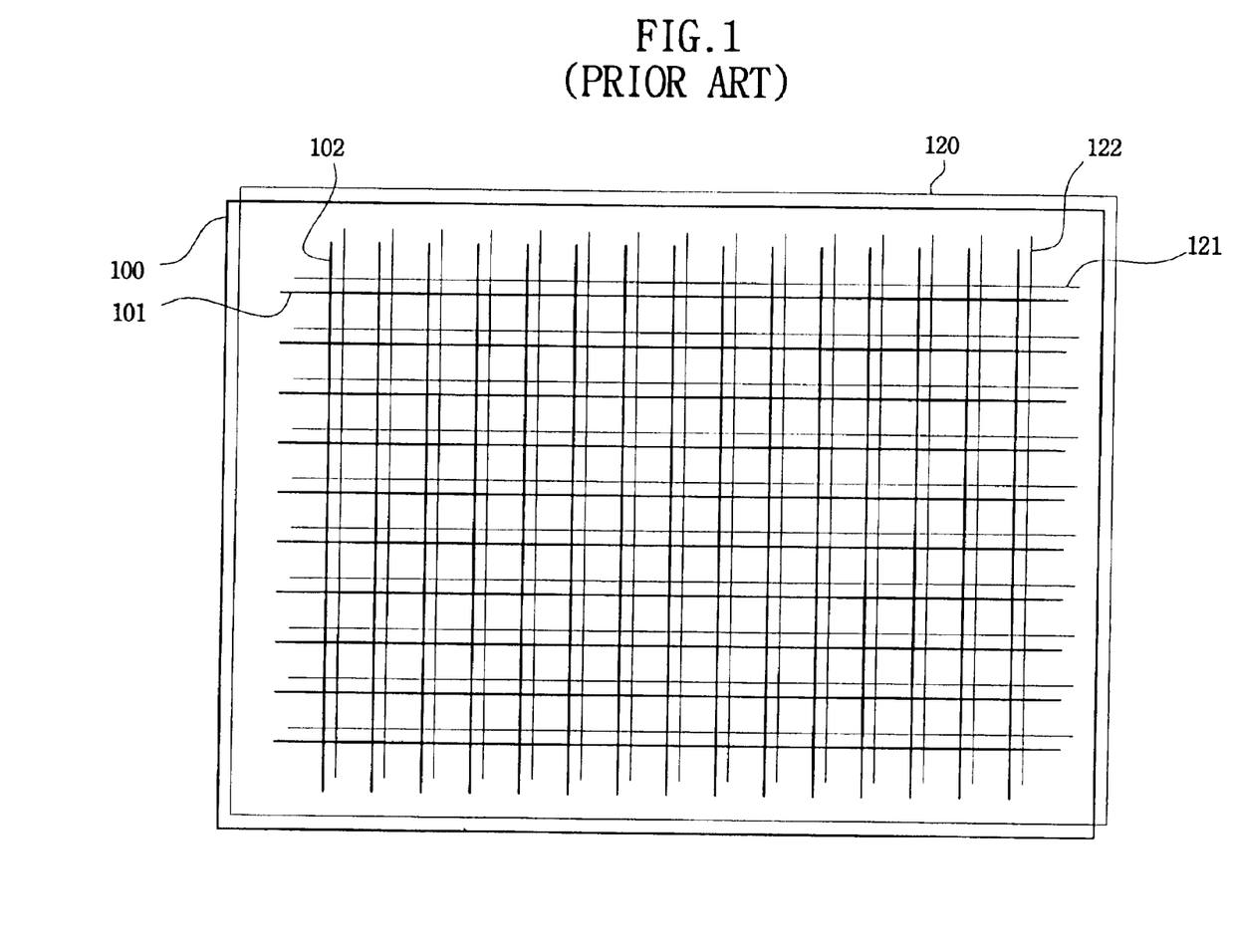
FIG. 1 is a plane view showing a conventional fingerprint recognition device disposed on an LCD panel.

FIG. 1 is a plane view showing a conventional fingerprint recognition device disposed on an LCD panel.

As shown in FIG. 1, pixel areas of a fingerprint recognition device 120 may be misaligned with pixel areas of an LCD panel 100 while the fingerprint recognition device 120 is disposed on the LCD panel 100. Thus, a gate line 101 and a data line 102 of the LCD panel 100 may interfere with a gate line 121 and a sensing signal output line 122 of the fingerprint recognition device 120, thereby appearing a latticed pattern on the fingerprint recognition device 120.

As a result, a screen of the LCD panel 100 may be partially dark due to the latticed pattern and brightness of the LCD panel 100 may be deteriorated.

BRIEF SUMMARY OF THE INVENTION

The present invention provides an image recognition apparatus capable of improving a display quality and productivity.

The present invention provides an LCD apparatus having the above image recognition apparatus.

In one aspect of the invention, an image recognition apparatus includes a transparent substrate having fours sides, a plurality of gate lines spaced apart from each other in a predetermined distance, the gate lines having a predetermined slope such that the gate lines intersect with two sides of the four sides, which are adjacent to or facing each other, a plurality of sensing signal output lines spaced apart from each other in a predetermined distance and substantially perpendicular to the gate lines, and an image recognition sensor disposed on a pixel area, the image recognition sensor sensing an image pattern of an object in response to a gate on/off signal applied through the gate lines so as to output an image recognition signal to the sensing signal output lines.

The image recognition sensor may include a photoelectric sensor that senses the image pattern using a reflecting light reflected from the object or a capacitance type image recognition sensor that senses the image pattern using a capacitance variation between the object and the image recognition sensor.

The object is a human being and the image pattern is obtained from a human finger of the human being.

In another aspect of the invention, an LCD apparatus includes an LCD panel displaying an image, an image recognition part including a transparent substrate having fours sides, a plurality of gate lines spaced apart from each other in a predetermined distance, the gate lines having a predetermined slope such that the gate lines intersect with two sides of the four sides, which are adjacent to or facing each other, a plurality of sensing signal output lines spaced apart from each other in a predetermined distance and substantially perpendicular to the gate lines, and an image recognition sensor disposed on a pixel area, and a backlight assembly disposed under the LCD panel.

The image recognition sensor senses an image pattern of an object in response to a gate on/off signal applied through the gate lines so as to output an image recognition signal to the sensing signal output lines, and the backlight assembly supplying a light to the LCD panel and image recognition device.

The object is a human being and the image pattern is obtained from a human finger of the human being.

According to the image recognition apparatus and LCD apparatus, although the image recognition apparatus is misaligned with the LCD panel 210, the LCD apparatus may prevent appearance of the moiré image thereon and deterioration of the display quality of the LCD panel, thereby improving the productivity thereof.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Hereinafter, an image recognition apparatus for recognizing an image pattern, for example, such as a fingerprint image from an object, will be described.

Particularly, in this exemplary embodiment, a fingerprint recognition apparatus and an LCD apparatus having the same that recognizes an image pattern, for example, such as the fingerprint image from a human being, will be described. That is, the object having the image pattern may comprise at least the fingerprint image of the human being.

Figure 2:
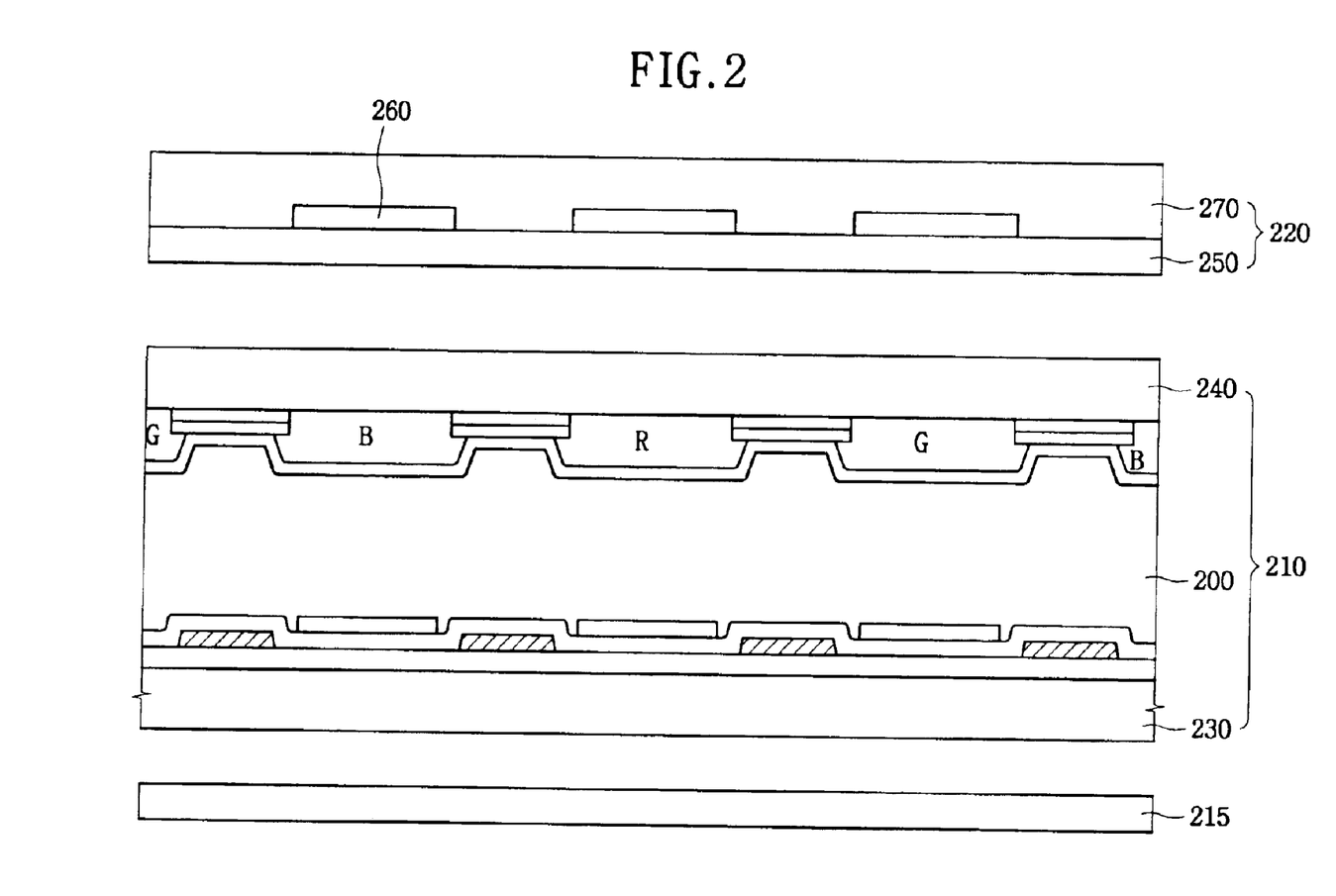
FIG. 2 is a cross-sectional view showing an LCD apparatus according to an exemplary embodiment of the present invention.

FIG. 2 is a cross-sectional view showing an LCD apparatus according to an exemplary embodiment of the present invention.

Referring to FIG. 2, an LCD apparatus includes an LCD panel 210 having liquid crystal 200 for transmitting a light in response to an electrical signal provided from an external, a fingerprint recognition device 220 disposed on the LCD panel 210, for recognizing a fingerprint image corresponding to a light reflected from a sensing object, and a backlight assembly 215 disposed under the LCD panel 210, for providing the light to the LCD panel 210.

The LCD panel 210 includes a TFT (Thin Film Transistor) substrate 230, a color filter substrate 240 disposed on the TFT substrate 230 and the liquid crystal 200 interposed between the TFT substrate 230 and the color filter substrate 240.

The fingerprint recognition device 220 includes a transparent substrate 250 having a transparent material, for example, such as a glass, a fingerprint recognition sensor 260 formed on the transparent substrate 250, for sensing the fingerprint image of the sensing object, and a protection layer 270 formed over the transparent substrate 250 on which the fingerprint recognition sensor 260 is formed.

Hereinafter, the fingerprint recognition device will be described in detail with reference to accompanying drawings.

Figure 3:
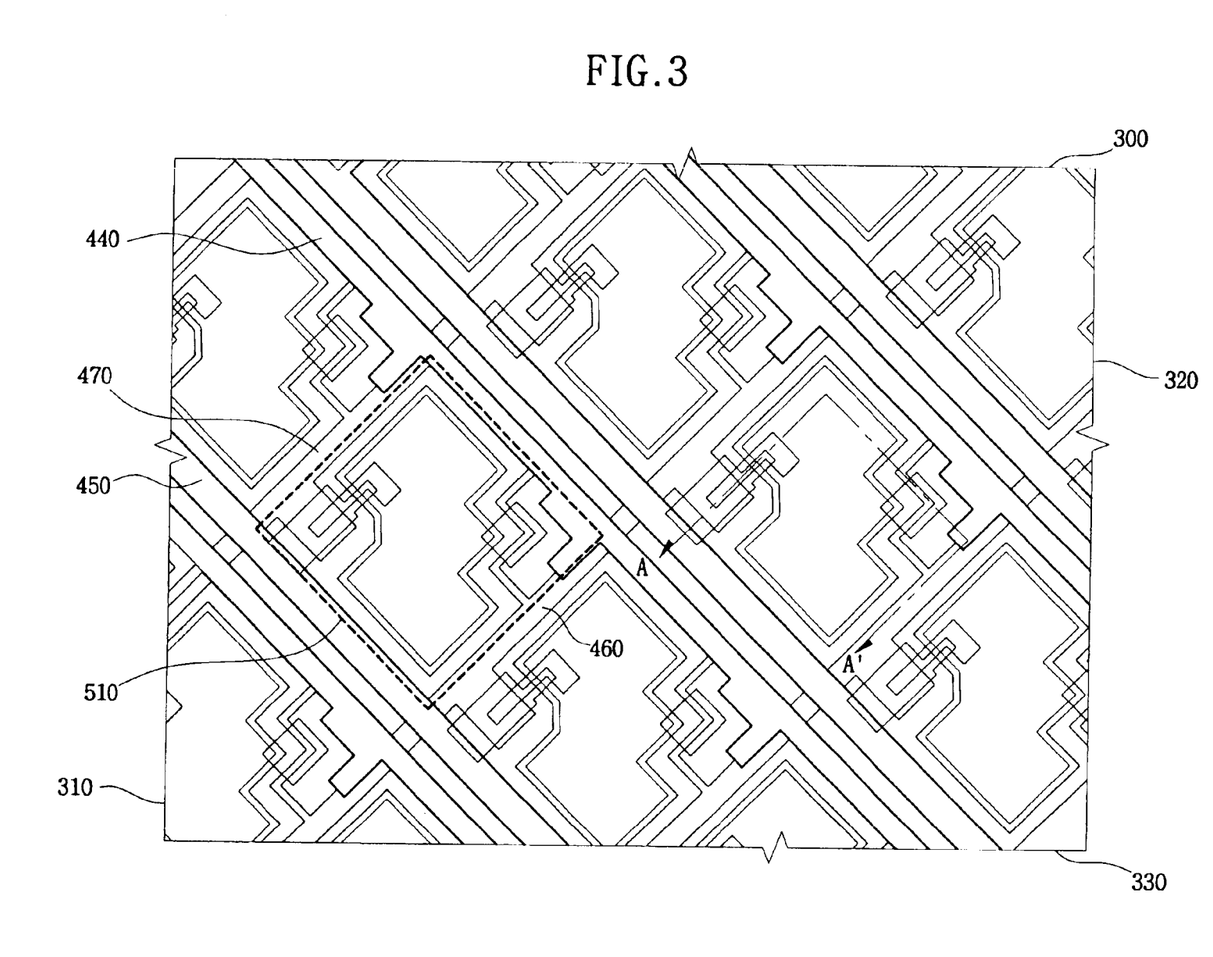
FIG. 3 is a plane view showing a fingerprint recognition device according to an exemplary embodiment of the present invention.
Figure 4:
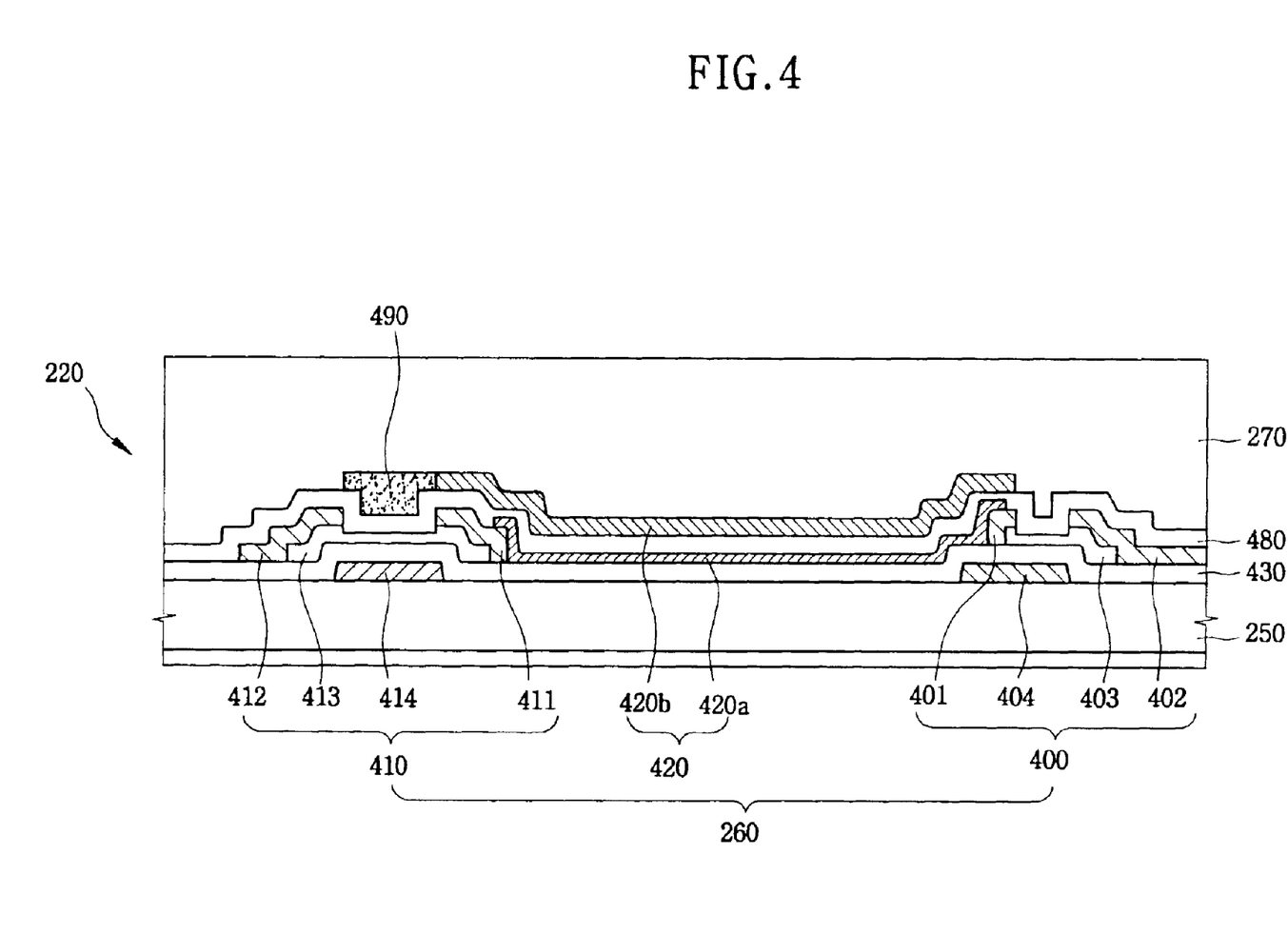
FIG. 4 is a cross-sectional view taken along the line A–A' showing the fingerprint recognition device shown in FIG. 3.

FIG. 3 is a plane view showing a fingerprint recognition device according to an exemplary embodiment of the present invention. FIG. 4 is a cross-sectional view taken along the line A–A' showing the fingerprint recognition device shown in FIG. 3.

Referring to FIGS. 3 and 4, the fingerprint recognition device 220 includes the fingerprint recognition sensor 260 arranged in a matrix configuration so as to recognize the fingerprint image of the sensing object.

The fingerprint recognition sensor 260 includes a first TFT 400, a second TFT 410 and a storage capacitor 420. The first TFT 400 acts as a sensing TFT that senses a reflecting light reflected from the fingerprint image of the sensing object so as to output a fingerprint recognition signal and the second TFT 410 acts as a switching TFT that is switched so as to allow the sensed fingerprint recognition signal to be outputted to the external. The storage capacitor 420 includes first and second electrodes 420a and 420b facing each other and charges an electron charge corresponding to the fingerprint recognition signal output from the first TFT 400.

The first TFT 400 includes a source electrode 401, a drain electrode 402 and a gate electrode 404 and the second TFT 410 includes a source electrode 411, a drain electrode 412 and a gate electrode 414. The first TFT 400 includes a first channel area 403 formed between the source and drain electrodes 401 and 402 thereof and the second TFT 410 includes a second channel area 413 formed between the source and drain electrodes 411 and 412 thereof. The first and second channel areas 403 and 413 include amorphous silicon. The fingerprint recognition device 220 includes a gate insulating layer 430 formed over the transparent substrate 250 on which the gate electrodes 404 and 414 of the first and second TFTs 400 and 410 are formed so as to insulate the source and drain electrodes 401 and 402 of the first TFT 400 and the source and drain electrodes 411 and 412 of the second TFT 410.

The drain electrode 402 of the first TFT 400 is connected to an external power source line $V_{DD}$ and the source electrode 401 of the first TFT 400 is electrically connected to the source electrode 411 of the second TFT 410 by means of the storage capacitor 420. The drain electrode 412 of the second TFT 410 is connected to the sensing signal output line 450. The gate electrode 404 of the first TFT 400 and the gate electrode 414 of the second TFT 410 are connected to a sensing TFT gate line 460 and a switching TFT gate line 470, respectively. As shown in FIG. 3, the sensing TFT gate line 460 and the switching TFT gate line 470 are alternately formed with each other.

The first electrode 420a acts as a lower electrode of the storage capacitor 420 and electrically connects the source electrode 401 of the first TFT 400 and the source electrode 411 of the second TFT 410. An insulating layer 480 is formed over the transparent substrate 250 on which the first electrode 420a is formed. The second electrode 420b acts as an upper electrode of the storage capacitor 420 and is formed on the insulating layer 480 corresponding to the first electrode 420a. That is, the storage capacitor 420 includes the first electrode 420a, second electrode 420b and insulating layer 480 disposed between the first and second electrodes 420a and 420b and charges the electron charge in proportion to a light amount input into the first TFT 400.

In order to prevent the light from being incident on the second TFT 410, a shielding layer 490 is formed on the insulating layer 480 corresponding to the gate electrode 414 of the second TFT 410. A protection layer 270 is formed over the transparent substrate 250 on which the shielding layer 490 is formed.

In this exemplary embodiment, the transparent substrate 250 has first, second, third and fourth sides 300, 310, 320 and 330. The sensing TFT gate line 460 and switching TFT gate line 470 have a predetermined slope such that the sensing and switching TFT gate lines 460 and 470 intersect with two sides of the first, second, third and fourth sides 300, 310, 320 and 330, which are adjacent to or facing each other.

That is, the sensing and switching TFT gate lines 460 and 470 may intersect with the first and second sides 300 and 310, first and third sides 300 and 320, first and fourth sides 300 and 330, second and third sides 310 and 320, second and fourth sides 310 and 330 or third and fourth sides 320 and 330. The predetermined slope of the sensing and switching TFT gate lines 460 and 470 is from about 22.5 to about 45 degrees with respect to the fourth side 330.

The sensing signal output line 450 is substantially perpendicular to the sensing and switching TFT gate lines 460 and 470.

Thus, as shown in FIG. 3, a pixel area 50 that is defined by two sensing signal output lines adjacent to each other, sensing TFT gate line 460, and switching TFT gate line 470 has a rectangular shape that is positioned at an angle with respect to the first, second, third and fourth sides 300, 310, 320 and 330 of the transparent substrate 250. When a rectangular shape is "positioned at an angle with respect to" a side of the substrate, none of the sides of the rectangular are parallel to the sides of the substrate.

Figure 5:
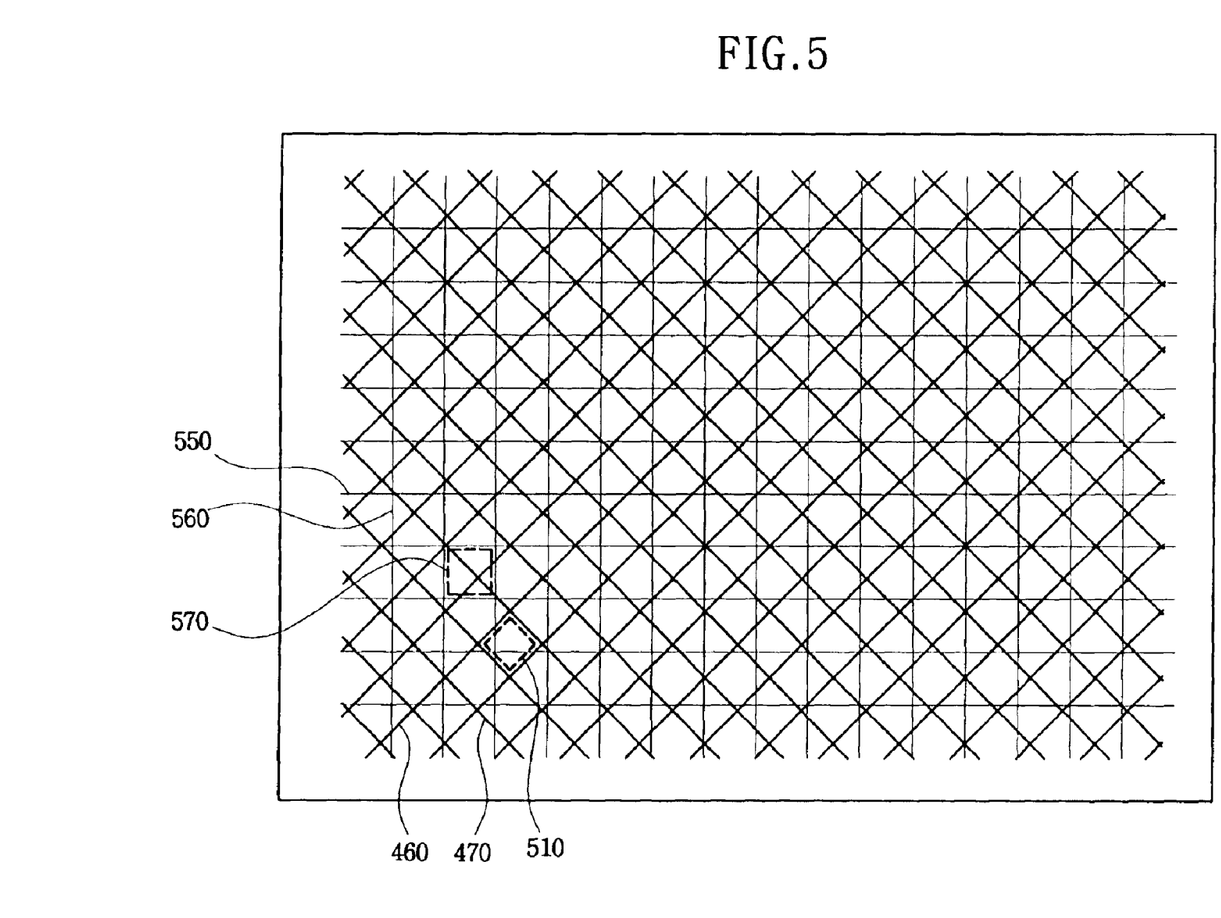
FIG. 5 is a plane view showing the fingerprint recognition device combined with the LCD panel shown in FIG. 2.

FIG. 5 is a plane view showing the fingerprint recognition device combined with the LCD panel shown in FIG. 2.

Referring to FIG. 5, when the fingerprint recognition device 220 is combined with the LCD panel 210, the pixel area 510 of the fingerprint recognition device 220 is pivoted on the predetermined direction with respect to a pixel area 570 of the LCD panel 210 disposed under the fingerprint recognition device 220.

That is, the sensing TFT gate line 460 and switching TFT gate line 470 are inclined in a predetermined slope against a gate line 550 and a data line 560 of the LCD panel 210, so that the pixel area 510 defined by two sensing signal output lines adjacent to each other, sensing TFT gate line 460 and switching TFT gate line 470 has the rectangular shape that is positioned at an angle with respect to the first, second, third and fourth sides 300, 310, 320 and 330 of the transparent substrate 250.

The gate line 550 of the LCD panel 210 is extended in a first direction and arranged in a second direction substantially perpendicular to the first direction and the data line 560 is extended in the second direction and arranged in the first direction. Thus, the pixel area 570 of the LCD panel 210, defined by two gate lines 550 adjacent to each other and two data lines 560 adjacent to each other, has a rectangular shape.

As described above, the fingerprint recognition device 220 according to the exemplary embodiment includes the sensing TFT gate line 460 and switching TFT gate line 470 that are positioned at an angle with respect to the gate line 550 of the LCD panel 210. Thus, although the fingerprint recognition device 220 is not aligned with the LCD panel 210 when the fingerprint recognition device 220 is combined with the LCD panel 210, the LCD apparatus may prevent the appearance of a moiré image thereon.

Hereinafter, an operation mechanism of the fingerprint recognition device will be described.

The drain electrode 402 of the first TFT 400 receives a direct current voltage $V_{DD}$ having a predetermined voltage level and the gate electrode 404 thereof receives a bias voltage.

When the sensing object having the fingerprint image, for example, such as a human finger, makes contact with the fingerprint recognition device 220, the light emitted from the backlight assembly 215 is supplied to the fingerprint recognition device 220 through the liquid crystal 200 of the LCD panel 210.

The light supplied to the transparent substrate 250 of the fingerprint recognition devise 220 is reflected from the fingerprint image of the sensing object and supplied to the first channel area 403 of the first TFT 400, thereby turning on the first TFT 400. In response to the light, the storage capacitor 420 is charged in proportion to the amount of light that is supplied to the first channel area 403 of the first TFT 400.

The second TFT 410 is switched in response to a gate driving signal provided from a gate driving section (not shown) through the gate electrode 414 thereof. In order to scan the fingerprint image, the gate driving section outputs the gate driving signal at every frame so as to switch the second TFT 410. Thus, the fingerprint image of the sensing object making contact with the fingerprint recognition device 220 may be scanned through the first TFT 400 arranged in the matrix configuration.

The second TFT 410 outputs a voltage signal proportional to the charge in the storage capacitor 420 through the sensing signal output line 450. Also, since the drain electrode 412 of the second TFT 410 is connected to a data reading section (not shown) of an amplifying section (not shown) by means of the sensing signal output line 450, the voltage signal output from the second TFT 410 may be amplified to a predetermined voltage level.

Figure 6:
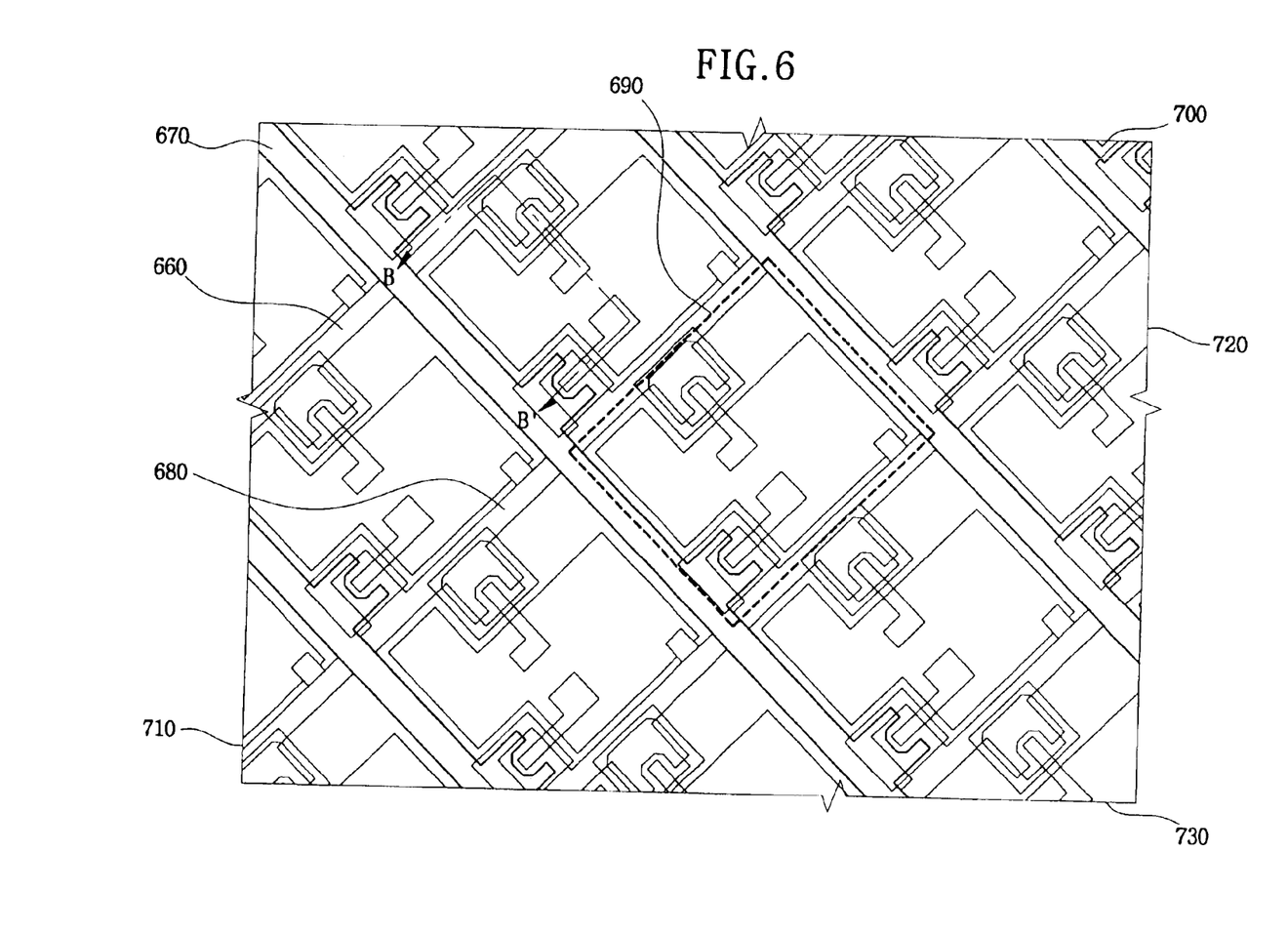
FIG. 6 is a plane view showing a fingerprint recognition device according to another exemplary embodiment of the present invention.
Figure 7:
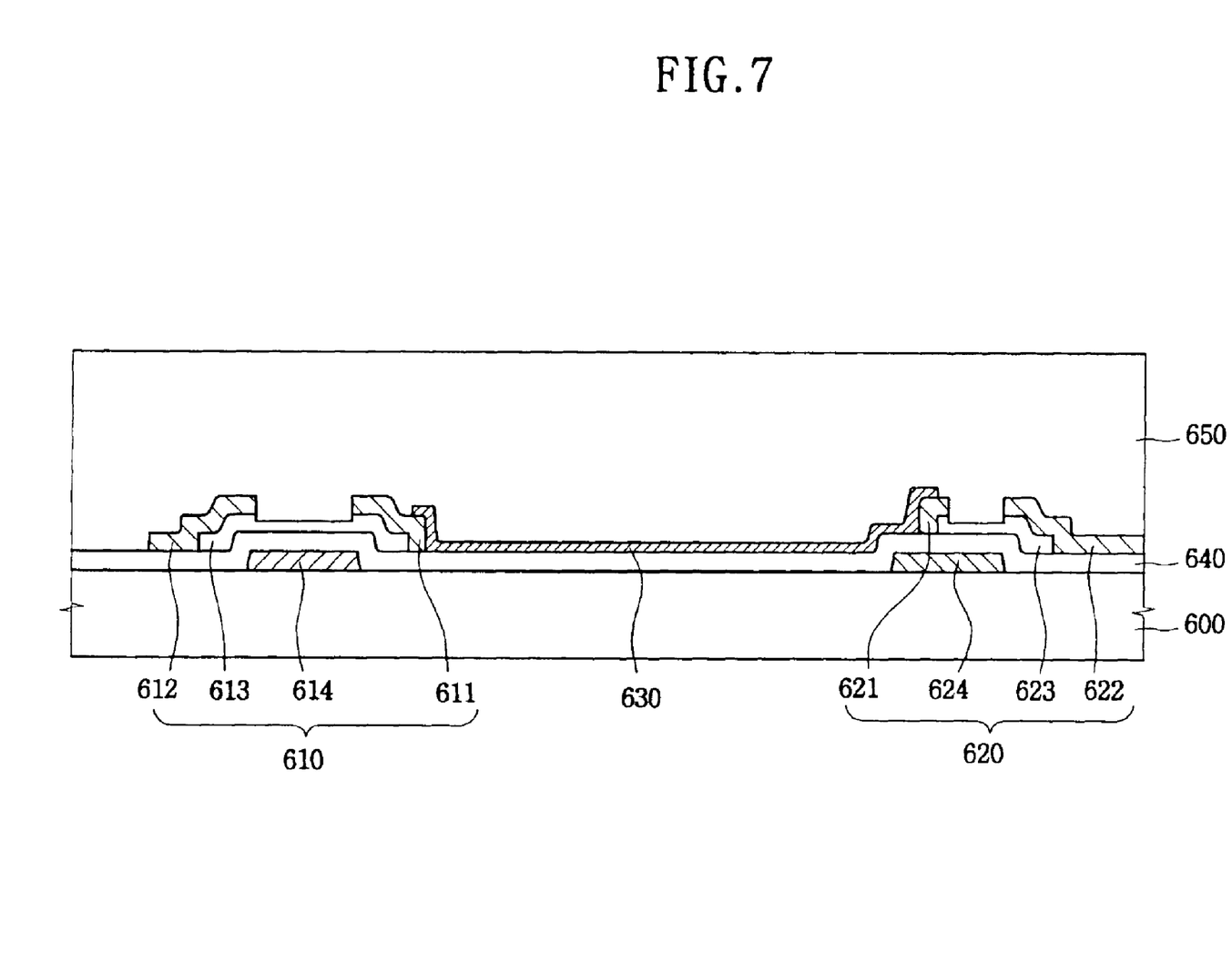
FIG. 7 is a cross-sectional view taken along the line B–B' showing the fingerprint recognition device shown in FIG. 6.

FIG. 6 is a plane view showing a fingerprint recognition device according to another exemplary embodiment of the present invention. FIG. 7 is a cross-sectional view taken along the line B–B' showing the fingerprint recognition device shown in FIG. 6.

Although not shown in FIGS. 6 and 7, an LCD apparatus having the fingerprint recognition device according to another exemplary embodiment of the present invention partially includes same elements as in those of the fingerprint recognition device of the LCD apparatus shown in FIGS. 3 and 4. In this exemplary embodiment, the same reference numerals denote the same elements in FIGS. 3 and 4, and thus the detailed descriptions of the same elements will be omitted.

The LCD apparatus includes an LCD panel 210 having a TFT substrate 230 and a color filter substrate 240, a fingerprint recognition device 220 disposed on the LCD panel 210 and a backlight assembly 215 disposed under the LCD panel 210.

The fingerprint recognition device 220 includes a fingerprint recognition sensor 260 that recognizes a fingerprint image of a sensing object using a capacitance variation and a protection layer 270 formed on the fingerprint recognition sensor 260. The sensing object making contact with the fingerprint recognition device 220 acts as an upper electrode of a capacitor.

Referring to FIGS. 6 and 7, the fingerprint recognition sensor 260 includes a first TFT 610, a second TFT 620 and a conductive sensing electrode 630, which are formed on a transparent substrate 600.

The first TFT 610 includes a source electrode 611, a drain electrode 612 and a gate electrode 614 and the second TFT 620 includes a source electrode 621, a drain electrode 622 and a gate electrode 624. The first TFT 610 includes a first channel area 613 formed between the source and drain electrodes 611 and 612 thereof and the second TFT 620 includes a second channel area 623 formed between the source and drain electrodes 621 and 622 thereof. The first and second channel areas 613 and 623 include amorphous silicon. The fingerprint recognition device 220 includes a gate insulating layer 640 formed over the transparent substrate 600 on which the gate electrodes 614 and 624 of the first and second TFTs 610 and 620 are formed so as to insulate the source and drain electrodes 611 and 612 of the first TFT 610 and the source and drain electrodes 621 and 622 of the second TFT 620.

The drain and gate electrodes 612 and 614 of the first TFT 610 are connected to a first gate line and source electrodes 611 and 621 of the first and second TFTs 610 and 620 are electrically connected to each other by means of the conductive sensing electrode 630. The drain electrode 622 of the second TFT 620 is connected to a sensing signal output line 670 and the gate electrode 624 of the second TFT 620 is connected to a second gate line 680 adjacent to the first gate line 660.

A protection layer 650 is formed over the transparent substrate 600 on which the first TFT 610, second TFT 620 and conductive sensing electrode 630 are formed.

The conductive sensing electrode 630 acts as a lower electrode of the capacitor and the sensing object making contact with the fingerprint recognition device 220 acts as the upper electrode of the capacitor. That is, the conductive sensing electrode 630, protection layer 650 and sensing object act as the capacitor.

The first and second gate lines 660 and 680, which are respectively connected to the gate electrodes 614 and 624 of the first and second TFTs 610 and 620, have a predetermined slope such that the first and second gate lines 660 and 680 intersect with two sides of first, second, third and fourth sides 700, 710, 720 and 730 of the transparent substrate 600, which are adjacent to or facing each other.

That is, the first and second gate lines 660 and 680 may intersect with the first and second sides 700 and 710, first and third sides 700 and 720, first and fourth sides 700 and 730, second and third sides 710 and 720, second and fourth sides 710 and 730 or third and fourth sides 720 and 730. The predetermined slope of the sensing and switching TFT gate lines 460 and 470 is from about 22.5 to about 45 degrees with respect to the fourth side 730.

The sensing signal output line 670 is substantially perpendicular to the first and second gate lines 660 and 680. The sensing signal output line 670 has a slope from about 22.5 to about 45 degrees with respect to the fourth side 730.

Thus, as shown in FIG. 6, a pixel area 690 that is defined by two sensing signal output lines adjacent to each other, a first gate line 660, and a second gate line 680 has a rectangular shape that is positioned at an angle with respect to the first, second, third and fourth sides 700, 710, 720 and 730 of the transparent substrate 600.

As described above, the fingerprint recognition device 220 according to another exemplary embodiment of the present invention includes the first and second gate lines 660 and 680 and sensing signal output line 670 that is positioned at an angle with respect to first, second, third and fourth sides 700, 710, 720 and 730 of the transparent substrate 600. Thus, although the fingerprint recognition device 220 is not aligned with the LCD panel 210 when the fingerprint recognition device 220 is combined with the LCD panel 210, the LCD apparatus may prevent the appearance of the moiré image thereon.

Hereinafter, an operation mechanism of the fingerprint recognition device according to another exemplary embodiment of the present invention will be described.

The first TFT 610 is switched in response to a gate driving signal provided from a gate driving section (not shown) through the gate electrode 614 connected to the first gate line 660 and applies a voltage signal to the conductive sensing electrode 630.

The conductive sensing electrode 630 senses a capacitance corresponding to a distance between the fingerprint and the conductive sensing electrode 630. The capacitance may be different depending on a position of the fingerprint because a fingerprint is made of ridges and valleys. The distance between a "higher" ridge portion and the conductive sensing electrode 630 is different from the distance between a "recessed" valley portion of the fingerprint and the conductive sensing electrode 630.

The second TFT 620 is switched in response to the gate-on signal provided from the gate driving section (not shown) through the gate electrode 624 thereof and applies the voltage signal to the sensing signal output line 670. The voltage signal corresponds to the capacitance sensed by the conductive sensing electrode 630.

As described above, the first and second gate lines 660 and 680 of the fingerprint recognition device 220 are inclined positioned at an angle with respect to first, second, third and fourth sides 700, 710, 720 and 730 of the transparent substrate 600. Also, the sensing signal output line 670 is substantially perpendicular to the first and second gate lines 660 and 680.

Thus, although the first and second gate lines 660 and 680 of the fingerprint recognition device 220 are not aligned with gate and data lines of the LCD panel 210, the LCD apparatus may prevent the appearance of the moiré image thereon.

Furthermore, the LCD apparatus may prevent deterioration of the display quality of the LCD panel and improve the productivity thereof.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An image recognition apparatus comprising:
   a transparent substrate having four sides;
   a plurality of gate lines disposed on the transparent substrate and spaced apart from each other by a predetermined distance, the gate lines having a predetermined slope such that the gate lines intersect with two sides of the four sides, which are adjacent to or facing each other;
   a plurality of sensing signal output lines disposed on the transparent substrate, spaced apart from each other by a predetermined distance and substantially perpendicular to the gate lines; and
   an image recognition sensor disposed on a pixel area, the image recognition sensor sensing an image pattern of an object in response to a gate on/off signal applied through the gate lines so as to output an image recognition signal to the sensing signal output lines.

2. The apparatus of claim 1, wherein the predetermined slope is from about 22.5 to about 45 degrees.

3. The apparatus of claim 1, wherein the image recognition sensor comprises a photoelectric sensor.

4. The apparatus of claim 3, wherein the image recognition sensor comprises:
   a first TFT connected to a gate line adjacent thereto, the first TFT sensing the image pattern corresponding to a reflecting light reflected from the object;
   a storage capacitor that charges an electron charge corresponding to the image pattern from the first TFT; and
   a second TFT connected to the gate line adjacent thereto, the second TFT outputting a voltage signal as the image recognition signal corresponding to the electron charge charged into the storage capacitor to a sensing signal output line adjacent thereto.

5. The apparatus of claim 1, wherein the image recognition sensor comprises a capacitance type image recognition sensor that senses the image pattern using a capacitance variation between the object and the image recognition sensor.

6. The apparatus of claim 5, wherein the image recognition sensor comprises:
   a first TFT connected to a gate line adjacent thereto;
   a conductive sensing electrode that charges an electron charge corresponding to a distance variation between the object and the image recognition sensor in response to the first TFT turned on; and
   a second TFT that outputs a voltage signal as the image recognition signal corresponding to the electron charge charged into the conductive sensing electrode to a sensing signal output line adjacent thereto.

7. The apparatus of claim 1, wherein the object is a human being and the image pattern is obtained from a human finger of the human being.

8. An image recognition apparatus comprising:

a transparent substrate having four sides;

a plurality of gate lines disposed on the transparent substrate and spaced apart from each other by a predetermined distance, the gate lines having a predetermined slope such that the gate lines intersect with two sides of the four sides, which are adjacent to or facing each other;

a plurality of sensing signal output lines disposed on the transparent substrate, spaced apart from each other by a predetermined distance and substantially perpendicular to the gate lines; and an image recognition sensor disposed on a pixel area, responsive to a gate on/off signal applied through the gate lines, and image recognition sensor sensing an image pattern of an object and outputting an image recognition signal to the sensing signal output lines, which is corresponding to a reflecting light reflected from the image pattern printed on the object.

9. The apparatus of claim 8, wherein the predetermined slope is from about 22.5 to about 45 degrees.

10. The apparatus of claim 8, wherein the image recognition sensor comprises:

a first TFT connected to a gate line adjacent thereto, the first TFT sensing the image pattern in response to the reflecting light reflected from the object;

a storage capacitor that charges an electron charge corresponding to the image pattern from the first TFT; and a second TFT connected to the gate line adjacent thereto, the second TFT outputting a voltage signal as the image recognition signal corresponding to the electron charge charged into the storage capacitor to a sensing signal output line adjacent thereto.

11. The apparatus of claim 8, wherein the object is a human being and the image pattern is obtained from a human finger of the human being.

12. An image recognition apparatus comprising:

a transparent substrate having four sides;

a plurality of gate lines disposed on the transparent substrate and spaced apart from each other by a predetermined distance, the gate lines having a predetermined slope such that the gate lines intersect with two sides of the four sides, which are adjacent to or facing each other;

a plurality of sensing signal output lines disposed on the transparent substrate, spaced apart from each other by a predetermined distance and substantially perpendicular to the gate lines; and an image recognition sensor disposed on a pixel area, the image recognition sensor sensing an image pattern of an object and outputting an image recognition signal to the sensing signal output lines, which is corresponding to a distance variation between an object and the image recognition sensor.

13. The apparatus of claim 12, wherein the predetermined slope is from about 22.5 to about 45 degrees.

14. The apparatus of claim 12, wherein the image recognition sensor comprises:

a first TFT connected to a gate line adjacent thereto;

a conductive sensing electrode that charges an electron charge corresponding to the distance variation between the object and the image recognition sensor; and a second TFT that outputs a voltage signal as the image recognition signal corresponding to the electron charge charged into the conductive sensing electrode to a sensing signal output line adjacent thereto.

15. The apparatus of claim 12, wherein the object is a human being and the image pattern is obtained from a human finger of the human being.

16. An LCD apparatus comprising:

An LCD panel that displays an image;

An image recognition part including a first transparent substrate having fours sides, a plurality of gate lines spaced apart from each other by a predetermined distance, the gate lines having a predetermined slope such that the gate lines intersect with two sides of the four sides, which are adjacent to or facing each other, a plurality of sensing signal output lines spaced apart from each other by a predetermined distance and substantially perpendicular to the gate lines, and an image recognition sensor disposed on a pixel area, the image recognition sensor sensing an image pattern of an object in response to a gate on/off signal applied through the gate lines so as to output an image recognition signal to the sensing signal output lines; and a backlight assembly disposed under the LCD panel, the backlight assembly supplying a light to the LCD panel and the image recognition part.

17. The LCD apparatus of claim 16, wherein the predetermined slope is from about 22.5 to about 45 degrees.

18. The LCD apparatus of claim 16, wherein the image recognition sensor comprises a photoelectric sensor that senses the image pattern using a reflecting light reflected from the object or a capacitance type image recognition sensor that senses the image pattern using a capacitance variation between the object and the image recognition sensor.

19. The LCD apparatus of claim 16, wherein the LCD panel comprises;

a second transparent substrate;

a plurality of gate lines disposed on the second transparent substrate; and a plurality of gate lines disposed on the second transparent substrate and substantially perpendicular to the gate lines, wherein the gate and data lines are inclined in the predetermined slope with respect to the gate lines and sensing signal output lines disposed on the first transparent substrate.

20. The LCD apparatus of claim 16, wherein the object is a human being and the image pattern is obtained from a human finger of the human being.

* * * * *